United States Patent [19]

Tsuda et al.

[11] Patent Number: 4,757,260

[45] Date of Patent: Jul. 12, 1988

[54] METHOD OF PRODUCING NUCLEAR MAGNETIC RESONANCE OF AN OBJECT AND AN APPARATUS THEREFOR

[75] Inventors: Munetaka Tsuda, Mito; Kazutoshi Higuchi, Katsuta, both of Japan

[73] Assignee: Hitachi, Ltd., Tokyo, Japan

[21] Appl. No.: 809,909

[22] Filed: Dec. 17, 1985

[30] Foreign Application Priority Data

Dec. 21, 1984 [JP] Japan .................. 59-270405

[51] Int. Cl.$^4$ .......................... G01R 33/20
[52] U.S. Cl. ................................. 324/309
[58] Field of Search .......... 324/307, 309, 312, 311, 324/314

[56] References Cited

U.S. PATENT DOCUMENTS

| | | | |
|---|---|---|---|
| 4,297,637 | 10/1981 | Crooks et al. | 324/309 |
| 4,458,203 | 7/1984 | Young | 324/309 |
| 4,549,139 | 10/1985 | MacFall et al. | 324/309 |
| 4,551,680 | 11/1985 | Macovski | 324/309 |
| 4,558,278 | 12/1985 | Young | 324/307 |
| 4,654,594 | 3/1987 | Sepponen | 324/309 |

FOREIGN PATENT DOCUMENTS 0112663 7/1984 European Pat. Off. .

OTHER PUBLICATIONS

"Nuclear Magnetic Resonance Whole-Body Imager Operating at 3.5 K Gauss", Crooks et al., Radiology, vol. 143, No. 1, Apr. 1982.

Bottomley, P. A., "NMR Imaging ... A Review", Rev. Sci. Instrum., 53(9), Sep. 1982.

Primary Examiner—Michael J. Tokar
Assistant Examiner—Kevin D. O'Shea
Attorney, Agent, or Firm—Antonelli, Terry & Wands

[57] ABSTRACT

A plurality of selective radio frequency $\pi$ pulses are applied to an object placed in a static magnetic field which has a magnetic field gradient, to select a plurality of slices of the object corresponding to these pulses. Nuclear magnetic resonance signals are generated from the slices in a manner that a time interval between the selection of slice and the generation of nuclear magnetic resonance signal remains substantially constant for all of the slices.

7 Claims, 3 Drawing Sheets

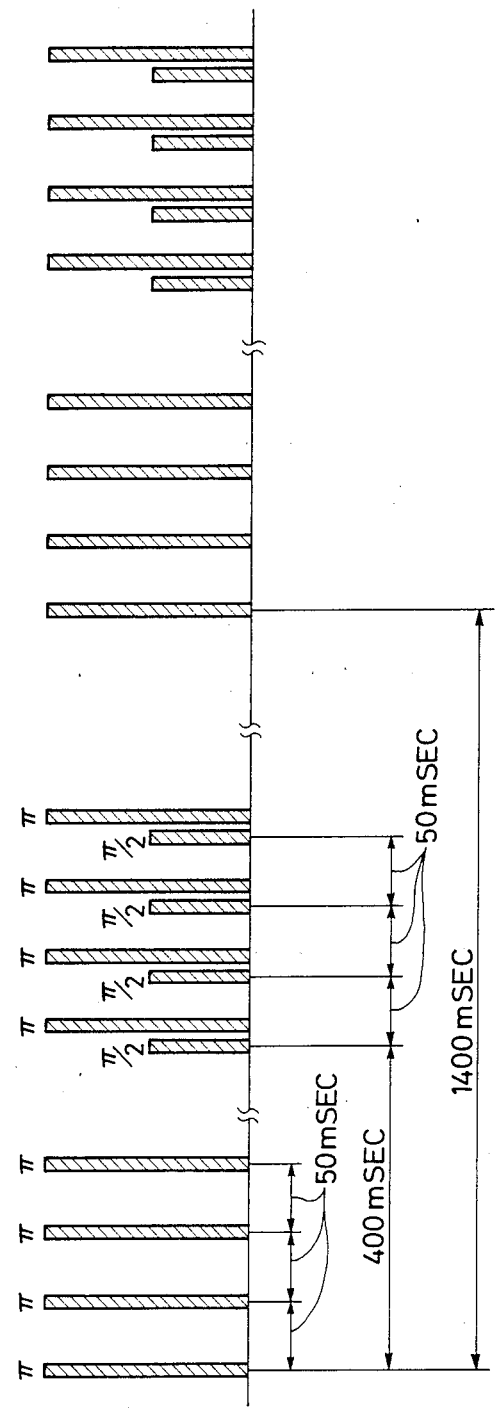

METHOD OF PRODUCING NUCLEAR MAGNETIC RESONANCE OF AN OBJECT AND AN APPARATUS THEREFOR

BACKGROUND OF THE INVENTION (1) Field of the Invention

The present invention relates to a method of producing nuclear magnetic resonance of an object and to an apparatus therefor. Particularly, the invention relates to a method of producing nuclear magnetic resonance in a plurality of slices of an object and to an apparatus therefor.

(2) Description of the Prior Art

The phenomenon of nuclear magnetic resonance has been utilized for the structural analysis of organic compounds and for the study of physical properties in the field of physics, and is currently finding applications in the field of medical diagnosis. In particular, it has been reported that data signals related to $T_1$ relaxation time (often called spin-lattice relaxation time or longitudinal relaxation time) that serve as nuclear magnetic resonance signals, are very effective for detecting cancer.

An apparatus which is so constructed as to utilize nuclear magnetic resonance signals for medical diagnosis is usually called a nuclear magnetic resonance imaging apparatus or a magnetic resonance imaging apparatus. Nuclear magnetic resonance imaging technology has been disclosed in U.S. Pat. No. 4,458,203 issued to Picker International, Limited, on July 3, 1984, according to which nuclear magnetic resonance signals of one or more slices are obtained within a $T_1$ relaxation time of a slice of an object. Therefore, the time for measurement can be greatly reduced compared with when nuclear magnetic resonance signals of other slices are obtained after the $T_1$ relaxation time of a slice has lapsed.

According to this technology, however, a series of selective radio frequency $\pi/2$ pulses are successively applied to the object after the nonselective radio frequency $\pi$ pulses are applied to the object. Therefore, homogeneity is lost among the nuclear magnetic resonance signal images of the slices of the object selected by the selective radio frequency $\pi/2$ pulses. That is, images of individual slices possess different $T_1$ relaxation time enhance values. This is not desirable from the viewpoint of medical diagnosis.

SUMMARY OF THE INVENTION

The object of the present invention therefore is to provide a method of producing nuclear magnetic resonance of an object, which is adapted to obtaining homogeneous nuclear magnetic resonance signal images of a plurality of slices of the object, and to provide an apparatus therefor.

According to the present invention, a static magnetic field is formed in space where the object is to be disposed, and a magnetic field gradient is applied to the static magnetic field. A plurality of selective radio frequency pulses are applied to the object in the presence of the magnetic field gradient to select a plurality of slices of the object corresponding to the selective radio frequency pulses according to a predetermined order. Nuclear magnetic resonance signals are generated from the selected slices in such a manner that the interval of time between the selection of a slice and the generation of a nuclear magnetic resonance signal is substantially constant for all of the slices.

The above object and features as well as other objects and features of the present invention will become obvious from the following description taken in conjunction with the accompanying drawings.

BRIEF DESCRIPTION OF THE DRAWINGS

FIG. 3 is a diagram which illustrates a train of selective radio frequency pulses applied to the object of FIG. 1.

DESCRIPTION OF THE PREFERRED EMBODIMENT

Figure 1:
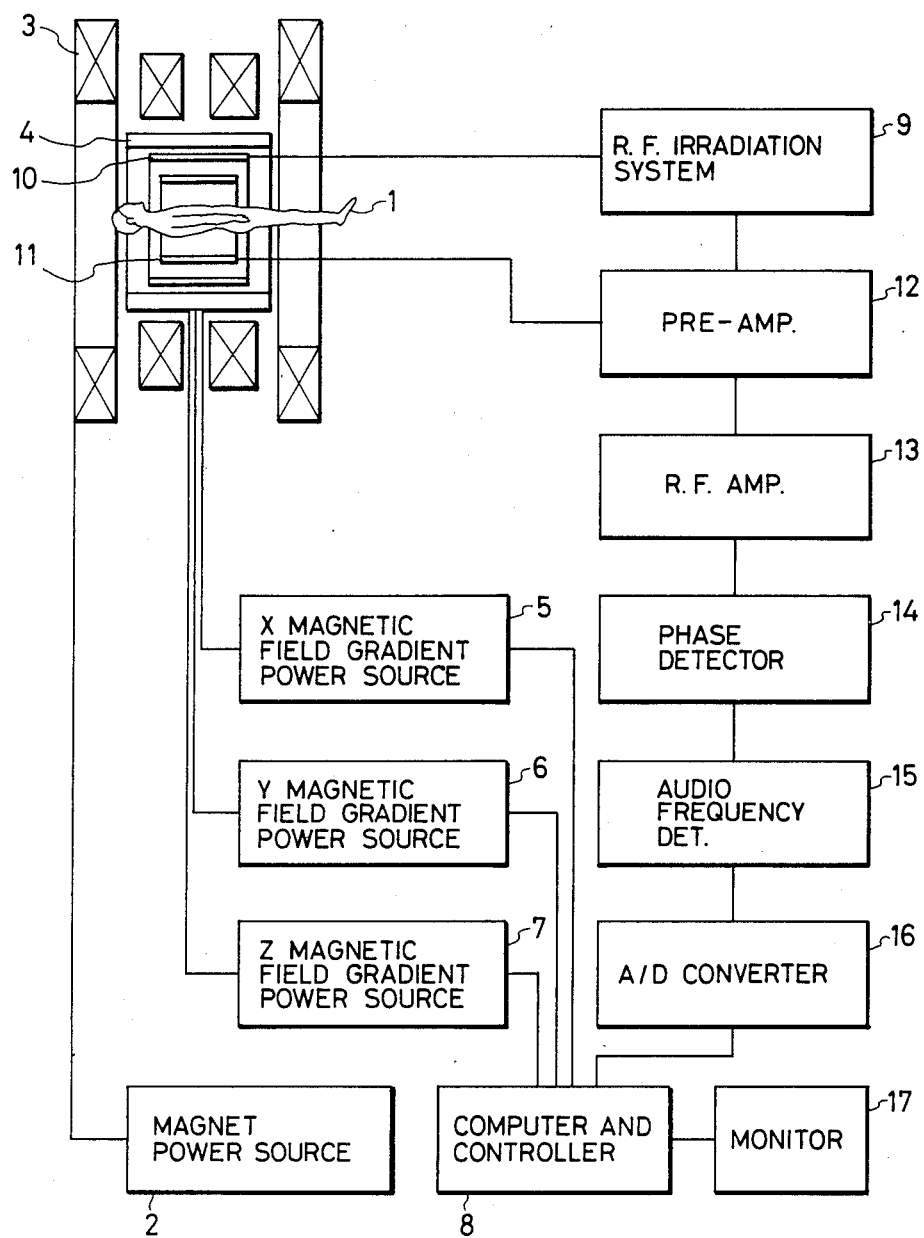
FIG. 1 is a block diagram of an apparatus for producing nuclear magnetic resonance signals of an object according to an embodiment of the present invention.

Referring to FIG. 1, a static magnetic field, in which a patient 1 which is an object is placed, is generated by a static magnetic field coil 3 that is driven by a magnet power source 2. To the static magnetic field is applied the magnetic field gradient of the X-, Y- and Z-directions by magnetic field gradient coils 4, the application of the magnetic field gradient being controlled by a computer and controller 8 that control X, Y and Z magnetic field gradient power sources 5, 6 and 7 which drive the magnetic field gradient coils 4.

Figure 2:
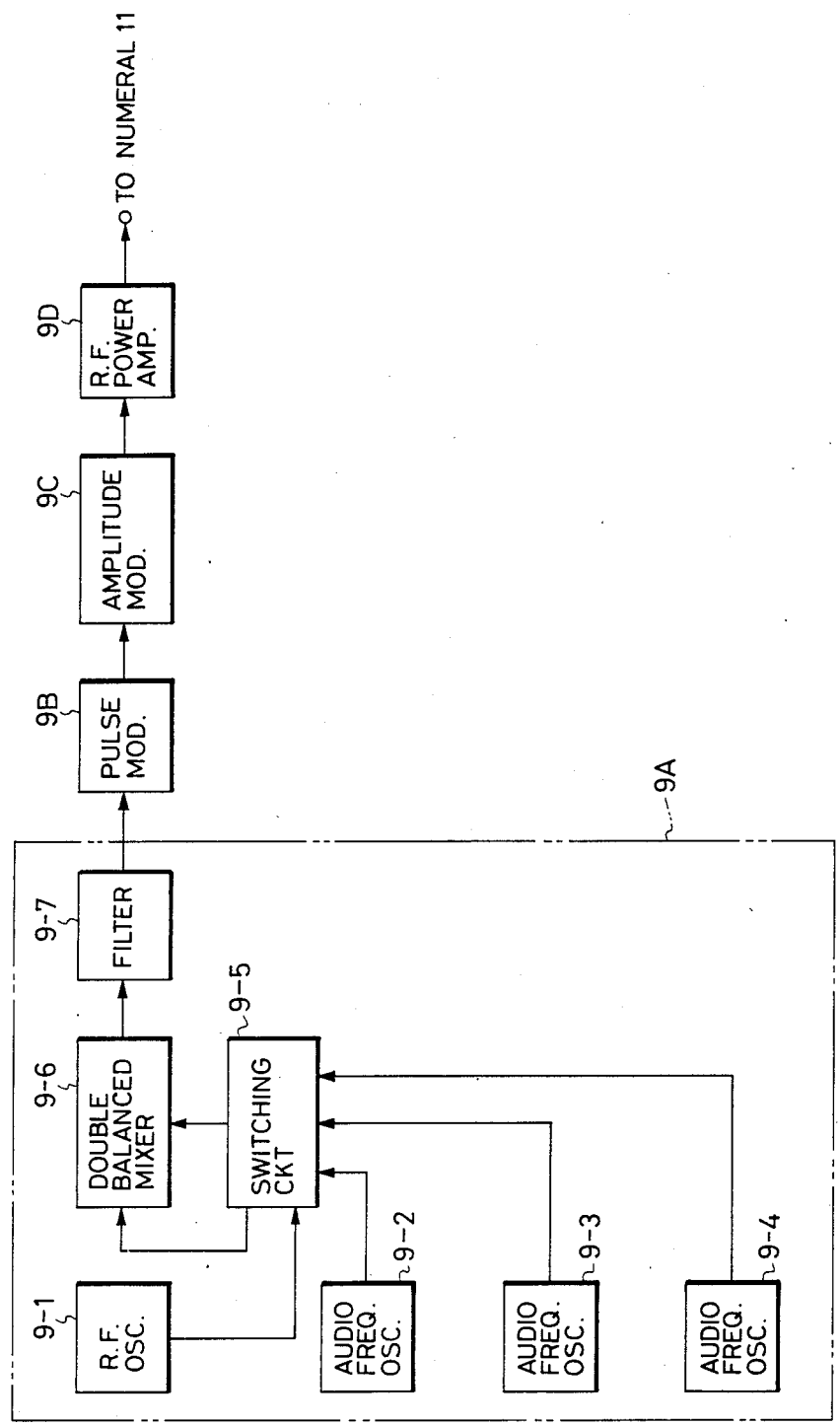
FIG. 2 is a block diagram of a radio frequency irradiation system of FIG. 1 according to the embodiment of the invention.

Radio frequency energy is applied to the object 1 by a radio frequency irradiation system 9 through a radio frequency coil 10, the application of energy being controlled by the computer and controller 8. FIG. 2 is a block diagram showing the radio frequency irradiation system 9. In a frequency synthesizer 9A shown in FIG. 2, a radio frequency $f_0$ generated by a radio frequency oscillator 9-1, and audio frequencies $fm_1$, $fm_2$ and $fm_3$ generated by audio frequency oscillators 9-2, 9-3, 9-4, are introduced into a double balanced mixer 9-6 via a switching circuit 9-5. The switching circuit 9-5 works so as (1) to introduce the radio frequency $f_0$ only to the mixer 9-6, (2) to introduce the radio frequency $f_0$ and the audio frequency $fm_1$ to the mixer 9-6, (3) to introduce the radio frequency $f_0$ and the audio frequency $fm_2$ to the mixer 9-6, and (4) to introduce the radio frequency $f_0$ and the audio frequency $fm_3$ to the mixer 9-6. The switching operation of the switching circuit 9-5 is controlled by the computer and controller 8.

When the radio frequency $f_0$ only is applied to the mixer 9-6, the radio frequency $f_0$ is then given to a pulse modulator 9B via the mixer 9-6 and filter 9-7. The pulse modulator 9B modulates the radio frequency $f_0$ relying upon modulation pulses to convert it into a pulse-like radio frequency. The pulse-like radio frequency is introduced into an amplitude modulator 9C which modulates the amplitude of the pulse-like radio frequency depending upon a SINC function. The amplitude-modulated pulse-like radio frequency is applied to the object 1 through a radio frequency power amplifier 9D. The pulse-like radio frequency applied to the object 1 consists of selective radio frequency pulses. If the amplitude is suitably changed, the selective radio frequency pulses turn into selective radio frequency $\pi$ pulses or selective radio frequency $\pi/2$ pulses. The amplitude of pulse-like radio frequency is selected by the amplifier modulator 9C to obtain radio frequency $\pi$ pulses or radio frequency $\pi/2$ pulses, and the timing of selection is controlled by the computer and controller 8. Further, the resonance frequency band of the selective radio frequency $\pi$ pulses and selective radio frequency $\pi/2$ pulses is determined by the width of the modulation pulses.

When the radio frequency $f_0$ and the audio frequency $fm_1$ are introduced into the mixer 9-6, the radio frequency $f_0$ and the audio frequency $fm_1$ are mixed together. That is, in the mixer 9-6, the radio frequency $f_0$ is modulated by the audio frequency $fm_1$, and the radio frequency of the first upper side waves $f_0+fm_1$ only passes through the filter 9-7, and whereby the selective radio frequency $\pi$ pulses or the selective radio frequency $\pi/2$ pulses of $f_0+fm_1$ are applied to the object 1. The same also holds true when the radio frequency $f_0$ and the audio frequency $fm_2$ are supplied to the mixer 9-6 and the radio frequency $f_0$ and when the audio frequency $fm_3$ are supplied to the mixer 9-6. In the former case, therefore, the selective radio frequency $\pi$ pulses or the selective radio frequency $\pi/2$ pulses of $f_0+fm_2$ are applied to the object and in the latter case, the selective radio frequency $\pi$ pulses or the selective radio frequency $\pi/2$ pulses of $f_0+fm_3$ are applied to the object 1.

FIG. 3 shows a train of selective radio frequency pulses of when four slices of the object 1 are selected and the nuclear magnetic resonance signals are generated from these selected slices. The selective radio frequency pulses are applied to the object while the magnetic field gradient of the Z-direction is being applied to the static magnetic field. The first four selective radio frequency $\pi$ pulses work to invert nuclear spins in the slices such that four slices of the object 1 are selected, the slices being perpendicular to the Z-axis and being parallel to each other. The intensity of the static magnetic field has been set to 1500 gauss. Here, since the resonance frequency of hydrogen nucleus is 6.375 MHz, the radio frequency of the first selective radio frequency $\pi$ pulses is set to 6.375 MHz. This is accomplished by setting the radio frequency to be $f_0=6.375$ MHz. Frequencies of the second, third and fourth selective radio frequency $\pi$ pulses applied to the object 1 maintaining a time interval of 50 msec are 6.3763 MHz, 6.3776 MHz and 6.3789 MHz, respectively. This is accomplished by setting the frequencies to be $fm_1=1.3$ KHz, $fm_2=2\times1.3$ KHz, and $fm_3=3\times1.3$ KHz.

After 400 msec has elapsed from the first selective radio frequency $\pi$ pulses, four pulse sets are applied to the object 1 maintaining a time interval of 50 msec. Each of the four pulse sets consists of a selective radio frequency $\pi/2$ pulse and a succeeding selective radio frequency $\pi$ pulse. The frequency of the selective radio frequency $\pi$ and $\pi/2$ pulses in the first pulse set is 6.375 MHz, the frequency of those of the second pulse set is 6.3763 MHz, the frequency of those of the third pulse set is 6.3776 MHz, and the frequency of those of the fourth pulse set is 6.3789 MHz. This is accomplished by setting the frequencies to be $f_0=6.375$ MHz, $fm_1=1.3$ KHz, $fm_2=2\times1.3$ KHz, and $fm_3=3\times1.3$ KHz.

The first slice selected by the first selective radio frequency $\pi$ pulse generates a spin echo signal which is a nuclear magnetic resonance signal responsive to the first pulse set. That is, the nuclear spin in the first slice nutates by 90 degrees due to the selective radio frequency $\pi/2$ pulse in the first pulse set. The nuclear spin dephases gradually. Thereafter, the selective radio frequency $\pi$ pulse is applied so that the nuclear spin is inverted. The spin then rephases gradually. When the nuclear spin is rephased, a free induction decay signal becomes maximum, which is a nuclear magnetic resonance signal generated from the first slice. This maximum signal is a spin echo signal.

The second slice selected by the second selective radio frequency $\pi$ pulse generates an echo signal responsive to the second pulse set. Similarly, the third slice selected by the third selective radio frequency $\pi$ pulse generates an echo signal responsive to the third pulse set, and the fourth slice selected by the fourth selective radio frequency $\pi$ pulse generates an echo signal responsive to the fourth pulse set. The measurement is carried out as a matter of course within the $T_1$ relaxation time of the first slice.

The above-mentioned operation is then repeated many times, for example, 256 times with a period of 1400 msec as a cycle.

Images of the slices can be obtained by the two-dimensional Fourier transform imaging method. If attention is given to the first slice, the magnetic field gradient of the Y-direction is applied to the static magnetic field in the first cycle after, for example, the first pulse set is applied but before the echo signal is generated. The spin echo signal generated thereafter is detected while the magnetic field gradient of the X-direction is being applied to the static magnetic field, and is subjected to a Fourier transform. The signal which is Fourier-transformed, is called the projection signal. The above-mentioned operation is repeated in the succeeding cycles while changing the amplitude of the magnetic field gradient in the Y-direction or changing the duration of its application little by little. Projection signals obtained by repeating the above-mentioned operation are subjected to another Fourier transform related to the magnetic field gradient of the Y-direction, whereby a first slice image is obtained. The same also holds true for other slices.

Application of the magnetic field gradation is controlled by the computer and controller 8 which control the X, Y and Z magnetic field gradient power sources 5, 6 and 7.

Referring to FIG. 1 again, the nuclear magnetic resonance signal generated from the object 1 is detected by a detector 11, amplified through a pre-amplifier 12 and a radio frequency amplifier 13, detected for its phase by a phase detector 14 with the radio frequency of the frequency synthesizer 9A as a reference signal, and is converted into an AF signal. The output signal of the phase detector 14 is amplified through an audio frequency amplifier 15, converted into a digital signal through an analog-to-digital converter 16, and is introduced into the computer and controller 8. The computer and controller 8 perform necessary processing such as averaging signals and Fourier transforms. As a result of processing, a monitor 17 displays a nuclear magnetic resonance signal image of the slice of the object 1.

In the embodiment mentioned in the foregoing, the time interval between the selection of the slice and the generation of the nuclear magnetic resonance signal remains constant for all of the slices. Therefore, homogeneous images of slices are obtained. That is, the slice images have the same $T_1$ relaxation enhance value.

The above-mentioned embodiment has dealt with the case where the number of slices was four. The number of slices, however, can be increased or decreased depending upon the requirements.

Though the invention was described by way of a preferred embodiment in conjunction with the drawings, it will be obvious that the invention can be further realized being modified in a variety of other forms by people skilled in the art without departing from the spirit of the invention. It should therefore be noted that the present invention is in no way limited to the embodiment only but encompasses the scope as defined by the claims.

What is claimed is:

1. A method of producing nuclear magnetic resonance of an object, which comprises the steps of:
    generating a static magnetic field in which the object will be disposed;
    applying a magnetic field gradient to the static magnetic field;
    applying a plurality of selective radio frequency pulses to the object in the presence of the magnetic field gradient to thereby select a plurality of slices of the object corresponding to the selective radio frequency pulses in a predetermined order; and
    generating nuclear magnetic resonance signals from the selected slices in such a manner that the interval of time between the selection of a slice and the generation of a nuclear magnetic resonance signal remains substantially constant for all of the slices, wherein the plurality of selective radio frequency pulses are composed of selective radio frequency $\pi$ pulses that invert nuclear spins in the plurality of slices, and the nuclear magnetic resonance signals are composed of spin echo signals that are generated by applying a plurality of pulse sets to said object, each of said plurality of pulse sets being composed of a selective radio frequency $\pi/2$ pulse and succeeding selective radio frequency $\pi$ pulse.

2. A method of producing nuclear magnetic resonance of an object according to claim 1, wherein said plurality of pulse sets are applied in the presence of said magnetic field gradient.

3. A method of producing nuclear magnetic resonance of an object according to claim 2, wherein said plurality of selective radio frequency $\pi$ pulses are applied to said object to select said plurality of slices and said plurality of pulse sets are applied to said object to generate said spin echo signals from the selected plurality of slices, during a $T_1$ relaxation time of nuclear spins in the slice that is selected first.

4. An apparatus for producing nuclear magnetic resonance of an object, which comprises:
    means for generating a static magnetic field in which the object will be placed;
    means for applying a magnetic field gradient to the static magnetic field;
    means for applying a plurality of selective radio frequency pulses to the object in the presence of the magnetic field gradient to thereby select, in a predetermined order, a plurality of slices of the object corresponding to the selective radio frequency pulses; and
    means for generating nuclear magnetic resonance signals from said selected slices in such a manner that the interval of time between the selection of a slice and the generation of a nuclear magnetic resonance signal remains substantially constant for all of the slices, wherein said plurality of radio frequency pulses are composed of selective radio frequency p pulses for inverting nuclear spins in said plurality of slices, and said nuclear magnetic resonance signal generating means comprises means which applies a plurality of pulse sets to said object such that spin echo signals are generated from said selected slices, each of said plurality of pulse sets being composed of a selective radio frequency $\pi/2$ pulse and a succeeding selective radio frequency $\pi$ pulse.

5. A method of producing nuclear magnetic resonance of an object, which comprises the steps of:
    generating a static magnetic field in which the object will be disposed;
    applying a magnetic field gradient to the static magnetic field;
    applying a plurality of selective radio frequency pulses to the object in the presence of the magnetic field gradient to thereby select a plurality of slices of the object corresponding to the selective radio frequency pulses in a predetermined order; and
    generating nuclear magnetic resonance signals from the selected slices in such a manner that the interval of time between the selection of a slice and the generation of a nuclear magnetic resonance signal remains substantially constant for all of the slices, wherein said plurality of selective radio frequency pulses are applied to said object to select said plurality of slices and said nuclear magnetic resonance signals are generated from said selected slices during a $T_1$ relaxation time of nuclear spins in the slice that is selected first.

6. An apparatus for producing nuclear magnetic resonance of an object, which comprises:
    means for generating a static magnetic field in which the object will be placed;
    means for applying a magnetic field gradient to the static magnetic field;
    means for applying a plurality of selective radio frequency pulses to the object in the presence of the magnetic field gradient to thereby select, in a predetermined order, a plurality of slices of the object corresponding to the selective radio frequency pulses; and
    means for generating nuclear magnetic resonance signals from said selected slices in such a manner that the interval of time between the selection of a slice and the generation of a nuclear magnetic resonance signal remains substantially constant for all of the slices, wherein said plurality of selective radio frequency pulses are applied to said object to select said plurality of slices and said nuclear magnetic resonance signals are generated from said selected slices during a $T_1$ relaxation time of nuclear spins in the slice that is selected first.

7. An apparatus for producing nuclear magnetic resonance of an object according to claim 6, wherein said plurality of pulse sets are applied in the presence of the magnetic field gradient.

* * * * *